(12) United States Patent
Sawada

(10) Patent No.: US 11,483,016 B2
(45) Date of Patent: Oct. 25, 2022

(54) RADIO FREQUENCY MODULE AND COMMUNICATION DEVICE

(71) Applicant: Murata Manufacturing Co., Ltd., Nagaokakyo (JP)

(72) Inventor: Yoichi Sawada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 239 days.

(21) Appl. No.: 17/019,399

(22) Filed: Sep. 14, 2020

(65) Prior Publication Data

US 2021/0091798 A1 Mar. 25, 2021

(30) Foreign Application Priority Data

Sep. 20, 2019 (JP) .............................. JP2019-172313

(51) Int. Cl.
*H04B 1/00* (2006.01)
*H03F 3/193* (2006.01)
*H04L 5/14* (2006.01)
*H03F 3/21* (2006.01)

(52) U.S. Cl.
CPC ........... *H04B 1/0064* (2013.01); *H03F 3/193* (2013.01); *H03F 3/21* (2013.01); *H04L 5/1461* (2013.01); *H03F 2200/294* (2013.01); *H03F 2200/318* (2013.01)

(58) Field of Classification Search
CPC ......... H03F 2200/294; H03F 2200/318; H03F 2200/451; H03F 2203/7209; H03F 3/193; H03F 3/195; H03F 3/21; H03F 3/245; H03F 3/72; H04B 1/0064; H04B 1/0458; H04L 5/14; H04L 5/1461
See application file for complete search history.

(56) References Cited

U.S. PATENT DOCUMENTS

2018/0131501 A1 5/2018 Little
2021/0367627 A1* 11/2021 Yamaguchi .......... H04B 1/0057

* cited by examiner

*Primary Examiner* — Nader Bolourchi
(74) *Attorney, Agent, or Firm* — Xsensus LLP

(57) ABSTRACT

A radio frequency module includes a mounting board, a power amplifier, a plurality of transmission filters, a first switch, an output matching circuit, a low-noise amplifier, and an external-connection terminal. The mounting board includes a first principal surface and a second principal surface on opposite sides of the mounting board. The first switch switches a connection between the power amplifier and the transmission filters. The output matching circuit is connected between the power amplifier and the first switch. The low-noise amplifier is disposed on the second principal surface of the mounting board. The external-connection terminal is disposed on the second principal surface of the mounting board. The power amplifier, the output matching circuit, the first switch, and the transmission filters are disposed on the mounting board in stated order in a direction that is orthogonal to a thickness direction of the mounting board.

20 Claims, 6 Drawing Sheets

RADIO FREQUENCY MODULE AND COMMUNICATION DEVICE

CROSS REFERENCE TO RELATED APPLICATION

The present application is based on and claims priority of Japanese Patent Application No. 2019-172313 filed on Sep. 20, 2019. The entire disclosure of the above-identified application, including the specification, drawings and claims is incorporated herein by reference in its entirety.

FIELD

The present disclosure generally relates to a radio frequency module and a communication device. In particular, the disclosure relates to a radio frequency module including a power amplifier and a plurality of transmission filters, and a communication device including the radio frequency module.

BACKGROUND

The existing radio frequency modules include power amplifiers and transmission filters (see, for example, United States Patent Application Publication No. 2018/0131501).

The radio frequency module disclosed in United States Patent Application Publication No. 2018/0131501 includes power amplifiers, transmission filters, and switches as elements for signal transmission. The switches switch connections between the power amplifiers and the transmission filters.

SUMMARY

Technical Problem

The existing radio frequency module disclosed in United States Patent Application Publication No. 2018/0131501 can have complex wiring between each power amplifier and the corresponding switch and between each switch and the corresponding transmission filters when these elements are disposed on a mounting board.

The present disclosure has been conceived in view of the above problem, and its aim is to provide a radio frequency module and a communication device that enable simple wiring.

Solution to Problem

The radio frequency module according to one aspect of the present disclosure includes a mounting board, a power amplifier, a plurality of transmission filters, a first switch, an output matching circuit, a low-noise amplifier, and an external-connection terminal. The mounting board includes a first principal surface and a second principal surface on opposite sides of the mounting board. The first switch switches a connection between the power amplifier and the plurality of transmission filters. The output matching circuit is connected between the power amplifier and the first switch. The low-noise amplifier is disposed on the second principal surface of the mounting board. The external-connection terminal is disposed on the second principal surface of the mounting board. The power amplifier, the output matching circuit, the first switch, and the plurality of transmission filters are disposed on the mounting board in stated order in a direction that is orthogonal to a thickness direction of the mounting board.

The communication device according to another aspect of the present disclosure includes the radio frequency module and a signal processing circuit. The signal processing circuit processes a signal.

Advantageous Effects

The radio frequency module and the communication device according to the above aspects of the present disclosure enable simple wiring.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Figure 1:
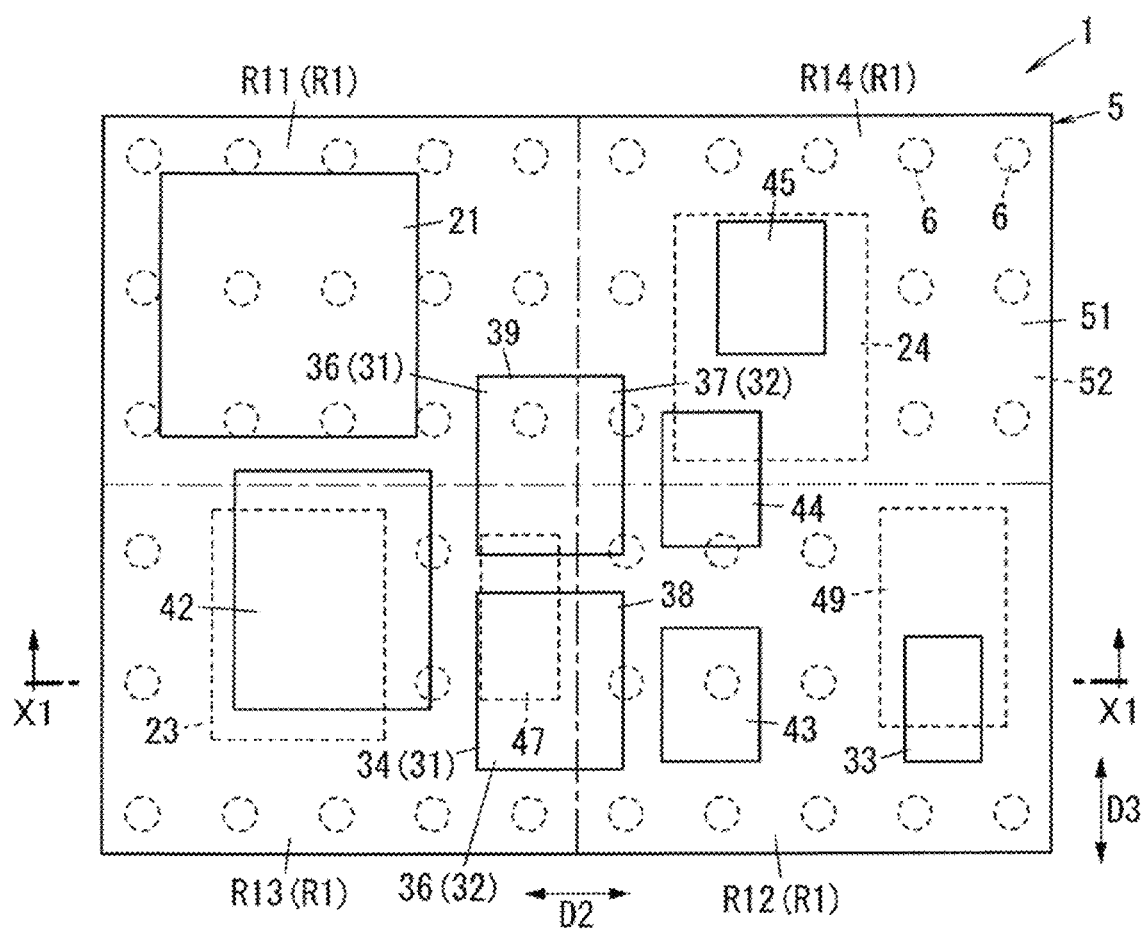
FIG. 1 is a front view of a radio frequency module according to an embodiment of the present disclosure.

The following describes the radio frequency module and the communication device according to the embodiment with reference to the drawings. FIG. 1 through FIG. 3, and FIG. 5 through FIG. 8 that are referred to in the following embodiment and so forth are schematic diagrams. The ratio of the dimension, thickness, and so forth, of each structural element in the drawings does not necessarily represent the actual dimension ratio.

Embodiment (1) Radio Frequency Module

The structure of the radio frequency module according to the embodiment will be described below with reference to the drawings.

Figure 4:
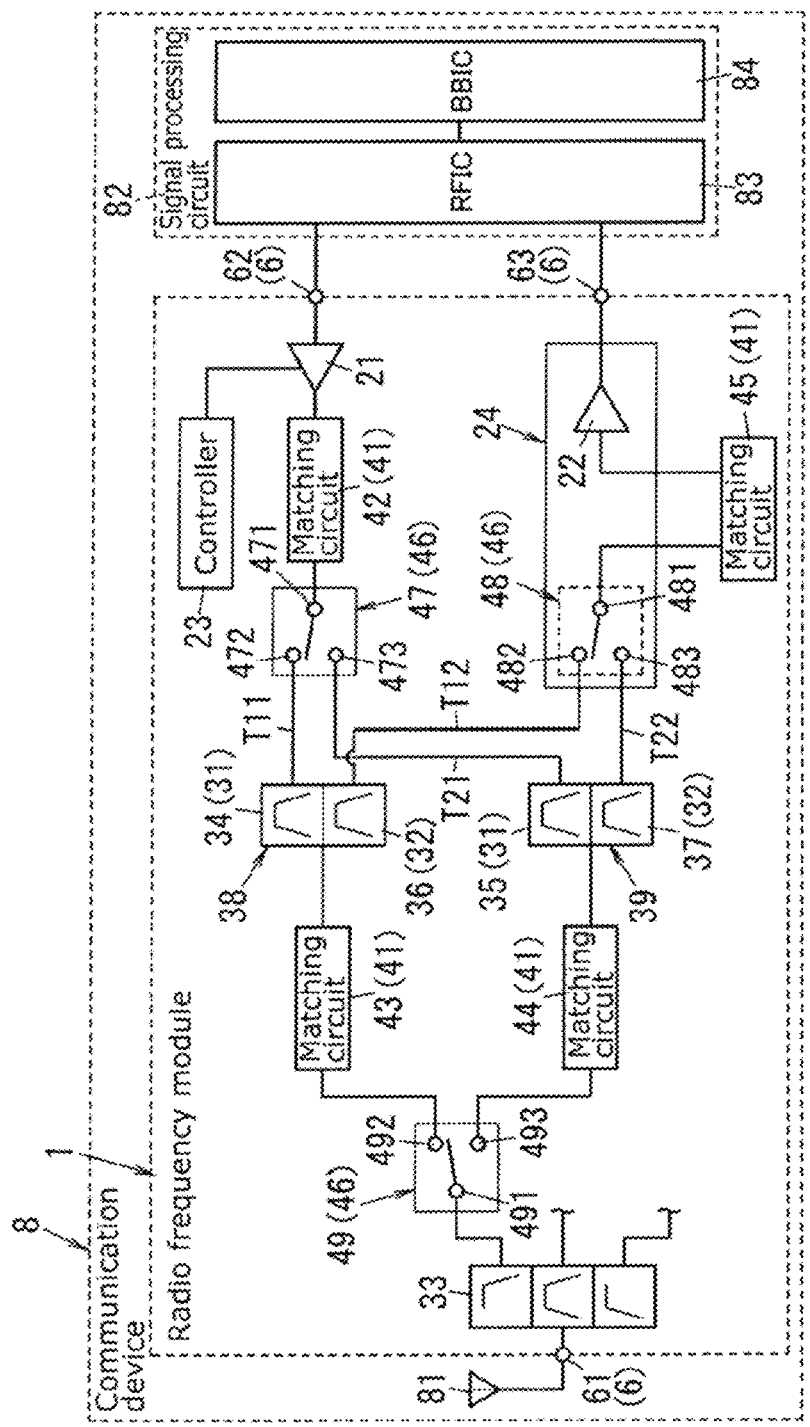
FIG. 4 is a circuit diagram of a communication device that includes the radio frequency module.

As shown in FIG. 4, radio frequency module 1 according to the embodiment includes power amplifier 21, low-noise amplifier 22, controller 23, a plurality of transmission filters 31, a plurality of reception filters 32, and filter 33. Transmission filters 31 include first transmission filter 34 and second transmission filter 35. Reception filters 32 include first reception filter 36 and second reception filter 37. First transmission filter 34 and first reception filter 36 are included in first duplexer 38. Second transmission filter 35 and second reception filter 37 are included in second duplexer 39.

Radio frequency module 1 also includes a plurality of matching circuits 41 (four matching circuits in the drawing) and a plurality of switches 46 (three switches in the drawing). Matching circuits 41 include output matching circuit 42, first matching circuit 43, second matching circuit 44, and input matching circuit 45. Switches 46 include first switch 47, second switch 48, and antenna switch 49. Second switch 48 and low-noise amplifier 22 are integrated on a single chip as reception IC 24.

Figure 2:
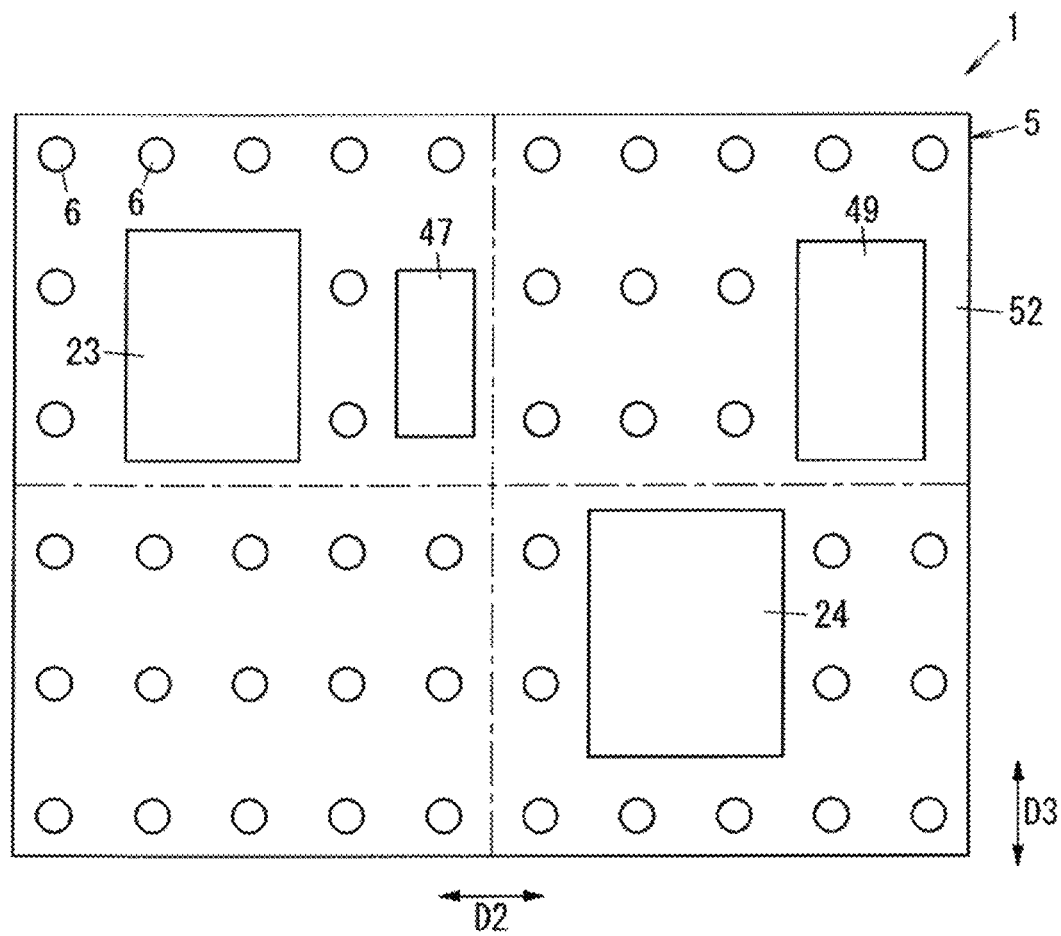
FIG. 2 is a back view of the radio frequency module.
Figure 3:
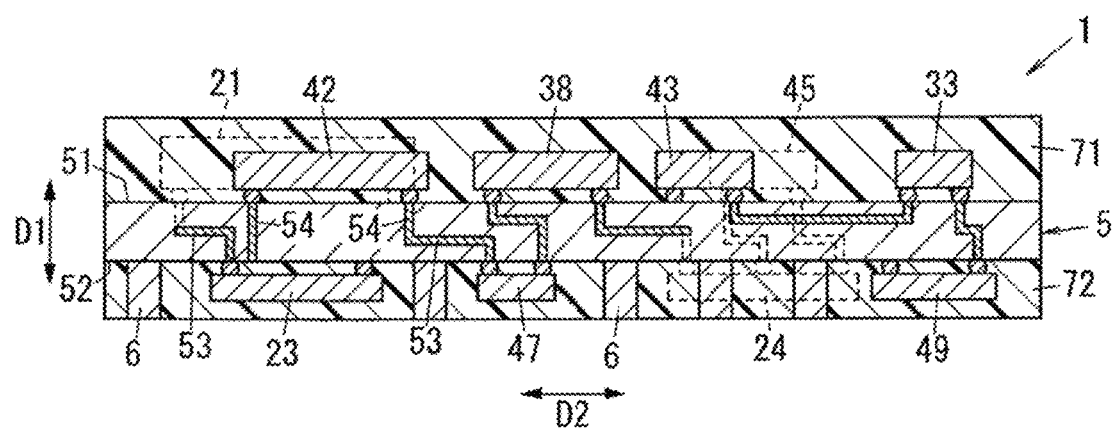
FIG. 3 is a cross-sectional view of the radio frequency module cut along X1-X1 in FIG. 1.

As shown in FIG. 1 through FIG. 3, radio frequency module 1 also includes mounting board 5, a plurality of external-connection terminals 6, first resin member 71, and second resin member 72.

As shown in FIG. 4, radio frequency module 1 is used, for example, for communication device 8. Examples of communication device 8 include, but not limited to, a mobile phone such as a smartphone. Alternatively, communication device 8 may be, for example, a wearable terminal such as a smartwatch.

Radio frequency module 1 performs communication in a first communication band and a second communication band. More specifically, radio frequency module 1 transmits a transmission signal in the first communication band (hereinafter "first transmission signal") and receives a reception signal in the first communication band (hereinafter "first reception signal"). Radio frequency module 1 also transmits a transmission signal in the second communication band (hereinafter "second transmission signal") and receives a reception signal in the second communication band (hereinafter "second reception signal").

The first transmission signal and the first reception signal are, for example, frequency division duplex (FDD) signals. FDD is a wireless communication technique, where transmission and reception in wireless communication are performed using different frequency bands allocated for transmission and reception. Note that the first transmission signal and the first reception signal are not limited to FDD signals, and thus may be time division duplex (TDD) signals. TDD is a wireless communication technique, where transmission and reception are switched to perform wireless communication in different time slots, using the same frequency band allocated for transmission and reception.

The second transmission signal and the second reception signal are, for example, FDD signals. Note that the second transmission signal and the second reception signal are not limited to FDD signals, and thus may be TDD signals.

(2) Circuit Structure of Radio Frequency Module

With reference to FIG. 4, the following describes the circuit structure of radio frequency module 1 according to the embodiment. The following describes an example case where the first transmission signal and the first reception signal, and the second transmission signal and the second reception signal are FDD signals.

(2.1) Power Amplifier

Power amplifier 21 shown in FIG. 4 is an amplifier that amplifies the amplitude of the first transmission signal and the amplitude of the second transmission signal. Power amplifier 21 is provided between input terminal 62 and output matching circuit 42 in first transmission path T11 and second transmission path T21 that connect antenna terminal 61 and input terminal 62. Power amplifier 21 includes an input terminal and an output terminal. The input terminal of power amplifier 21 is connected to an external circuit (e.g., signal processing circuit 82) via input terminal 62. Input terminal 62 is a terminal from which radio frequency signals (the first transmission signal and the second transmission signal) from an external circuit are inputted to radio frequency module 1. The output terminal of power amplifier 21 is connected to output matching circuit 42.

(2.2) Controller

Controller 23 shown in FIG. 4 controls power amplifier 21. More specifically, controller 23 controls power amplifier 21 on the basis of a control signal from signal processing circuit 82.

(2.3) Low-Noise Amplifier

Low-noise amplifier 22 shown in FIG. 4 is an amplifier that performs low-noise amplification of the amplitude of the first reception signal and the amplitude of the second reception signal. Low-noise amplifier 22 is provided between input matching circuit 45 and output terminal 63 in first reception path T12 and second reception path T22. Low-noise amplifier 22 includes an input terminal and an output terminal. The input terminal of low-noise amplifier 22 is connected to input matching circuit 45. The output terminal of low-noise amplifier 22 is connected to an external circuit (e.g., signal processing circuit 82) via output terminal 63. Output terminal 63 is a terminal from which radio frequency signals (first reception signal and second reception signal) from low-noise amplifier 22 are outputted to an external circuit.

(2.4) First Transmission Filter

First transmission filter 34 shown in FIG. 4 is a transmission filter for the first communication band that passes the first transmission signal. More specifically, first transmission filter 34 is provided between first switch 47 and first matching circuit 43 in first transmission path T11. First transmission filter 34 passes a transmission signal in the transmission frequencies of the first communication band, i.e., the first transmission signal, among the radio frequency signals amplified by power amplifier 21.

(2.5) Second Transmission Filter

Second transmission filter 35 shown in FIG. 4 is a transmission filter for the second communication band that passes the second transmission signal. More specifically, second transmission filter 35 is provided between first switch 47 and second matching circuit 44 in second transmission path T21. Second transmission filter 35 passes a transmission signal in the transmission frequencies of the second communication band, i.e., the second transmission signal, among the radio frequency signals amplified by power amplifier 21.

(2.6) First Reception Filter

First reception filter 36 shown in FIG. 4 is a reception filter for the first communication band that passes the first reception signal. More specifically, first reception filter 36 is provided between first matching circuit 43 and second switch 48 in first reception path T12 that connects antenna terminal 61 and output terminal 63. First reception filter 36 passes a reception signal in the reception frequencies of the first communication band, i.e., the first reception signal, among the radio frequency signals inputted from antenna terminal 61.

(2.7) Second Reception Filter

Second reception filter 37 shown in FIG. 4 is a reception filter for the second communication band that passes the second reception signal. More specifically, second reception filter 37 is provided between second matching circuit 44 and second switch 48 in second reception path T22 that connects antenna terminal 61 and output terminal 63. Second reception filter 37 passes a reception signal in the reception frequencies of the second communication band, i.e., the second reception signal, among the radio frequency signals inputted from antenna terminal 61.

(2.8) Filter

Filter 33 shown in FIG. 4 is provided at the output side of transmission filters 31 and at the input side of reception filters 32. Filter 33 passes transmission signals (first transmission signal and second transmission signal) and reception signals (first reception signal and second reception signal). More specifically, filter 33 is provided between antenna terminal 61 and antenna switch 49. Filter 33 includes, for example, a plurality of inductors and capacitors. Filter 33 may be an integrated passive device (IPD) that includes a plurality of inductors and capacitors. Note that filter 33 is included in a triplexer.

(2.9) Output Matching Circuit

Output matching circuit 42 shown in FIG. 4 includes at least an inductor (not illustrated). Output matching circuit 42 is connected between power amplifier 21 and first switch 47 in first transmission path T11 and second transmission path T21. Output matching circuit 42 matches the impedance between power amplifier 21 and first transmission filter 34 and matches the impedance between power amplifier 21 and second transmission filter 35.

(2.10) First Matching Circuit

First matching circuit 43 shown in FIG. 4 includes at least an inductor (not illustrated). First matching circuit 43 is provided at a position that is between first transmission filter 34 and antenna switch 49 in first transmission path T11 and that is between antenna switch 49 and first reception filter 36 in first reception path T12. First matching circuit 43 matches the impedance between first transmission filter 34 and filter 33 and matches the impedance between filter 33 and first reception filter 36.

(2.11) Second Matching Circuit

Second matching circuit 44 shown in FIG. 4 includes at least an inductor (not illustrated). Second matching circuit 44 is provided at a position that is between second transmission filter 35 and second switch 48 in second transmission path T21 and that is between second switch 48 and second reception filter 37 in second reception path T22. Second matching circuit 44 matches the impedance between second transmission filter 35 and filter 33 and matches the impedance between filter 33 and second reception filter 37.

(2.12) Input Matching Circuit

Input matching circuit 45 shown in FIG. 4 includes at least an inductor (not illustrated). Input matching circuit 45 is provided between antenna switch 49 and low-noise amplifier 22 in first reception path T12 and second reception path T22. Input matching circuit 45 matches the impedance between first reception filter 36 and low-noise amplifier 22 and matches the impedance between second reception filter 37 and low-noise amplifier 22.

(2.13) First Switch

As shown in FIG. 4, first switch 47 is a switch that switches a connection between power amplifier 21 and transmission filters 31.

First switch 47 includes common terminal 471 and a plurality of selection terminals 472 and 473 (two selection terminals in the drawing). Common terminal 471 is connected to output matching circuit 42. Of selection terminals 472 and 473, selection terminal 472 is connected to first transmission filter 34 and selection terminal 473 is connected to second transmission filter 35.

First switch 47 switches a connection between common terminal 471 and selection terminals 472 and 473. More specifically, first switch 47 is controlled by, for example, signal processing circuit 82. First switch 47 electrically connects common terminal 471 and at least one of selection terminals 472 and 473 according to a control signal from RF signal processing circuit 83 of signal processing circuit 82.

(2.14) Second Switch

As shown in FIG. 4, second switch 48 is a switch that switches a connection between low-noise amplifier 22 and reception filters 32.

Second switch 48 includes common terminal 481 and a plurality of selection terminals 482 and 483 (two selection terminals in the drawing). Common terminal 481 is connected to input matching circuit 45. Of selection terminals 482 and 483, selection terminal 482 is connected to first reception filter 36 and selection terminal 483 is connected to second reception filter 37.

Second switch 48 switches a connection between common terminal 481 and selection terminals 482 and 483. More specifically, second switch 48 is controlled by, for example, signal processing circuit 82. Second switch 48 electrically connects common terminal 481 and at least one of selection terminals 482 and 483 according to a control signal from RF signal processing circuit 83 of signal processing circuit 82.

(2.15) Antenna Switch

As shown in FIG. 4, antenna switch 49 is a switch that switches a connection between antenna terminal 61 and transmission filters 31.

Antenna switch 49 includes common terminal 491 and a plurality of selection terminals 492 and 493 (two selection terminals in the drawing). Common terminal 491 is connected to antenna terminal 61. Of selection terminals 492 and 493, selection terminal 492 is connected to first matching circuit 43 and selection terminal 493 is connected to second matching circuit 44. Antenna 81 is connected to antenna terminal 61.

Antenna switch 49 switches a connection between common terminal 491 and selection terminals 492 and 493. More specifically, antenna switch 49 is controlled by, for example, signal processing circuit 82. Antenna switch 49 electrically connects common terminal 491 and at least one of selection terminals 492 and 493 according to a control signal from RF signal processing circuit 83 of signal processing circuit 82.

(3) Structure of Radio frequency Module

The following describes the structure of radio frequency module 1 according to the embodiment with reference to the drawings.

As shown in FIG. 1 through FIG. 3, radio frequency module 1 includes mounting board 5, a plurality of external-connection terminals 6, first resin member 71, and second resin member 72.

Radio frequency module 1 is electrically connectable to an external board (not illustrated). The external board corresponds to, for example, a mother board of a mobile phone and a communication device. Note that "radio frequency module 1 is electrically connectable to an external board" includes not only the case where radio frequency module 1 is directly mounted on an external board, but also the case where radio frequency module 1 is indirectly mounted on an external board. Note that the case where radio frequency module 1 is directly mounted on an external board is the case where, for example, radio frequency module 1 is mounted on another radio frequency module that is mounted on the external board.

(3.1) Mounting Board

As shown in FIG. 1 through FIG. 3, mounting board 5 includes first principal surface 51 and second principal surface 52 on opposite sides of mounting board 5. First principal surface 51 and second principal surface 52 are opposed to each other in a thickness direction D1 of mounting board 5. Second principal surface 52 faces an external board (not illustrated) when radio frequency module 1 is provided on the external board. Mounting board 5 is a double-sided mounting board on which circuit elements are mounted on each of first principal surface 51 and second principal surface 52.

Mounting board 5 is a multi-layered board that includes laminated dielectric layers. Mounting board 5 includes a plurality of planar conductor portions 53 and a plurality of through electrodes 54. Planar conductor portions 53 include planar conductor portions that are set at the ground potential. Through electrodes 54 are used to electrically connect circuit elements mounted on first principal surface 51 and planar conductor portions 53 of mounting board 5. Through electrodes 54 are also used to electrically connect circuit elements mounted on first principal surface 51 and circuit elements mounted on second principal surface 52, and to electrically connect planar conductor portions 53 of mounting board 5 and external-connection terminals 6.

Disposed on first principal surface 51 of mounting board 5 are power amplifier 21, filter 33, first duplexer 38, second duplexer 39, and a plurality of matching circuits 41 (output matching circuit 42, first matching circuit 43, second matching circuit 44, and input matching circuit 45). Disposed on second principal surface 52 of mounting board 5 are reception IC 24 (low-noise amplifier 22 and second switch 48), controller 23, first switch 47, and antenna switch 49. Further disposed on second principal surface 52 of mounting board 5 are a plurality of external-connection terminals 6.

(3.2) Power Amplifier

As shown in FIG. 1 and FIG. 3, power amplifier 21 is disposed on first principal surface 51 of mounting board 5. Power amplifier 21 is mounted on first principal surface 51 of mounting board 5 in examples shown in FIG. 1 and FIG. 3. Note that part of power amplifier 21 may be mounted on first principal surface 51 of mounting board 5 with the remaining part of power amplifier 21 included inside of mounting board 5. Stated differently, in mounting board 5, a greater part of power amplifier 21 is on first principal surface 51 than on second principal surface 52 and at least part of power amplifier 21 is mounted on first principal surface 51.

(3.3) Controller

As shown in FIG. 2 and FIG. 3, controller 23 is disposed on second principal surface 52 of mounting board 5. Controller 23 is mounted on second principal surface 52 of mounting board 5 in examples shown in FIG. 2 and FIG. 3. Note that part of controller 23 may be mounted on second principal surface 52 of mounting board 5 with the remaining part of controller 23 included inside of mounting board 5. Stated differently, in mounting board 5, a greater part of controller 23 is on second principal surface 52 than on first principal surface 51 and at least part of controller 23 is mounted on second principal surface 52.

(3.4) First Duplexer

As shown in FIG. 1 and FIG. 3, first duplexer 38 is disposed on first principal surface 51 of mounting board 5. First duplexer 38 is mounted on first principal surface 51 of mounting board 5 in examples shown in FIG. 1 and FIG. 3. Note that part of first duplexer 38 may be mounted on first principal surface 51 of mounting board 5 with the remaining part of first duplexer 38 included inside of mounting board 5. Stated differently, in mounting board 5, a greater part of first duplexer 38 is on first principal surface 51 than on second principal surface 52 and at least part of first duplexer 38 is mounted on first principal surface 51.

First transmission filter 34 in first duplexer 38 is, for example, an acoustic wave filter that includes a plurality of series arm resonators and a plurality of parallel arm resonators. The acoustic wave filter is, for example, a surface acoustic wave (SAW) filter that utilizes surface acoustic waves. Also, first transmission filter 34 may include at least one of an inductor and a capacitor connected to one of the series arm resonators in series or in parallel, or may include an inductor or a capacitor connected to one of the parallel arm resonators in series or in parallel.

First reception filter 36 in first duplexer 38 is, for example, an acoustic wave filter that includes a plurality of series arm resonators and a plurality of parallel arm resonators, as in the case of first transmission filter 34. The acoustic wave filter is, for example, a SAW filter that utilizes surface acoustic waves. Also, first reception filter 36 may include at least one of an inductor and a capacitor connected to one of the series arm resonators in series or in parallel, or may include an inductor or a capacitor connected to one of the parallel arm resonators in series or in parallel.

(3.5) Second Duplexer

As shown in FIG. 1 and FIG. 3, second duplexer 39 is disposed on first principal surface 51 of mounting board 5. Second duplexer 39 is mounted on first principal surface 51 of mounting board 5 in examples shown in FIG. 1 and FIG. 3. Note that part of second duplexer 39 may be mounted on first principal surface 51 of mounting board 5 with the remaining part of second duplexer 39 included inside of mounting board 5. Stated differently, in mounting board 5, a greater part of second duplexer 39 is on first principal surface 51 than on second principal surface 52 and at least part of second duplexer 39 is mounted on first principal surface 51.

Second transmission filter 35 in second duplexer 39 is, for example, an acoustic wave filter that includes a plurality of series arm resonators and a plurality of parallel arm resonators. The acoustic wave filter is, for example, a SAW filter that utilizes surface acoustic waves. Also, second transmission filter 35 may include at least one of an inductor and a capacitor connected to one of the series arm resonators in series or in parallel, or may include an inductor or a capacitor connected to one of the parallel arm resonators in series or in parallel.

Second reception filter 37 in second duplexer 39 is, for example, an acoustic wave filter that includes a plurality of series arm resonators and a plurality of parallel arm resonators, as in the case of second transmission filter 35. The acoustic wave filter is, for example, a SAW filter that utilizes surface acoustic waves. Also, second reception filter 37 may include at least one of an inductor and a capacitor connected to one of the series arm resonators in series or in parallel, or may include an inductor or a capacitor connected to one of the parallel arm resonators in series or in parallel.

(3.6) Filter

As shown in FIG. 1 and FIG. 3, filter 33 is disposed on first principal surface 51 of mounting board 5. Filter 33 is mounted on first principal surface 51 of mounting board 5 in examples shown in FIG. 1 and FIG. 3. Note that part of filter 33 may be mounted on first principal surface 51 of mounting board 5 with the remaining part of filter 33 included inside of mounting board 5. Stated differently, in mounting board 5, a greater part of filter 33 is on first principal surface 51 than on second principal surface 52 and at least part of filter 33 is mounted on first principal surface 51.

(3.7) Reception IC

As shown in FIG. 2 and FIG. 3, reception IC 24 is disposed on second principal surface 52 of mounting board 5. Stated differently, low-noise amplifier 22 and second switch 48 are disposed on second principal surface 52 of mounting board 5. Reception IC 24 is mounted on second principal surface 52 of mounting board 5 in examples shown in FIG. 2 and FIG. 3. Note that part of reception IC 24 may be mounted on second principal surface 52 of mounting board 5 with the remaining part of reception IC 24 included inside of mounting board 5. Stated differently, in mounting board 5, a greater part of reception IC 24 is on second principal surface 52 than on first principal surface 51 and at least part of reception IC 24 is mounted on second principal surface 52.

(3.8) Output Matching Circuit

As shown in FIG. 1 and FIG. 3, output matching circuit 42 is disposed on first principal surface 51 of mounting board 5. An inductor (not illustrated) of output matching circuit 42 is, for example, a chip element mounted on first principal surface 51 of mounting board 5, or a planar conductor portion included inside of mounting board 5. The inductor of output matching circuit 42 is mounted on first principal surface 51 of mounting board 5 in examples shown in FIG. 1 and FIG. 3. Note that output matching circuit 42 may include a capacitor (not illustrated) together with the inductor. The capacitor is, for example, a chip element mounted on first principal surface 51 of mounting board 5, or may include two facing planar conductor portions included inside of mounting board 5. Stated differently, in mounting board 5, a greater part of output matching circuit 42 is on first principal surface 51 than on second principal surface 52 and at least part of output matching circuit 42 is mounted on first principal surface 51.

(3.9) First Matching Circuit

As shown in FIG. 1 and FIG. 3, first matching circuit 43 is disposed on first principal surface 51 of mounting board 5. An inductor (not illustrated) of first matching circuit 43 is, for example, a chip element mounted on first principal surface 51 of mounting board 5, or a planar conductor portion included inside of mounting board 5. The inductor of first matching circuit 43 is mounted on first principal surface 51 of mounting board 5 in examples shown in FIG. 1 and FIG. 3. Note that first matching circuit 43 may include a capacitor (not illustrated) together with the inductor. The capacitor is, for example, a chip element mounted on first principal surface 51 of mounting board 5, or may include two facing planar conductor portions included inside of mounting board 5. Stated differently, in mounting board 5, a greater part of first matching circuit 43 is on first principal surface 51 than on second principal surface 52 and at least part of first matching circuit 43 is mounted on first principal surface 51.

(3.10) Second Matching Circuit

As shown in FIG. 1 and FIG. 3, second matching circuit 44 is disposed on first principal surface 51 of mounting board 5. An inductor (not illustrated) of second matching circuit 44 is, for example, a chip element mounted on first principal surface 51 of mounting board 5, or a planar conductor portion included inside of mounting board 5. The inductor of second matching circuit 44 is mounted on first principal surface 51 of mounting board 5 in examples shown in FIG. 1 and FIG. 3. Note that second matching circuit 44 may include a capacitor (not illustrated) together with the inductor. The capacitor is, for example, a chip element mounted on first principal surface 51 of mounting board 5, or may include two facing planar conductor portions included inside of mounting board 5. Stated differently, in mounting board 5, a greater part of second matching circuit 44 is on first principal surface 51 than on second principal surface 52 and at least part of second matching circuit 44 is mounted on first principal surface 51.

(3.11) Input Matching Circuit

As shown in FIG. 1 and FIG. 3, input matching circuit 45 is disposed on first principal surface 51 of mounting board 5. An inductor (not illustrated) of input matching circuit 45 is, for example, a chip element mounted on first principal surface 51 of mounting board 5, or a planar conductor portion included inside of mounting board 5. The inductor of input matching circuit 45 is mounted on first principal surface 51 of mounting board 5 in examples shown in FIG. 1 and FIG. 3. Note that input matching circuit 45 may include a capacitor (not illustrated) together with the inductor. The capacitor is, for example, a chip element mounted on first principal surface 51 of mounting board 5, or may include two facing planar conductor portions included inside of mounting board 5. Stated differently, in mounting board 5, a greater part of input matching circuit 45 is on first principal surface 51 than on second principal surface 52 and at least part of input matching circuit 45 is mounted on first principal surface 51.

(3.12) First Switch

As shown in FIG. 2 and FIG. 3, first switch 47 is disposed on second principal surface 52 of mounting board 5. First switch 47 is mounted on second principal surface 52 of mounting board 5 in examples shown in FIG. 2 and FIG. 3. Note that part of first switch 47 may be mounted on second principal surface 52 of mounting board 5 with the remaining part of first switch 47 included inside of mounting board 5. Stated differently, in mounting board 5, a greater part of first switch 47 is on second principal surface 52 than on first principal surface 51 and at least part of first switch 47 is mounted on second principal surface 52.

(3.13) Antenna Switch

As shown in FIG. 2 and FIG. 3, antenna switch 49 is disposed on second principal surface 52 of mounting board 5. Antenna switch 49 is mounted on second principal surface 52 of mounting board 5 in examples shown in FIG. 2 and FIG. 3. Note that part of antenna switch 49 may be mounted on second principal surface 52 of mounting board 5 with the remaining part of antenna switch 49 included inside of mounting board 5. Stated differently, in mounting board 5, a greater part of antenna switch 49 is on second principal surface 52 than on first principal surface 51 and at least part of antenna switch 49 is mounted on second principal surface 52.

(3.14) External-Connection Terminals

A plurality of external-connection terminals 6 shown FIG. 2 and FIG. 3 are terminals that electrically connect mounting board 5 and an external board (not illustrated). External-connection terminals 6 include antenna terminal 61, input terminal 62, output terminal 63, and a plurality of ground electrodes shown in FIG. 4.

External-connection terminals 6 are disposed on second principal surface 52 of mounting board 5. External-connection terminals 6 are columnar (e.g., cylindrical) electrodes provided on second principal surface 52 of mounting board 5. External-connection terminals 6 are made, for example, of metal such as copper and copper alloy. External-connection terminals 6 each include a base end portion bonded to second principal surface 52 of mounting board 5 and a tip portion located at the opposite end of the base end portion in the thickness direction D1 of mounting board 5. The tip portion of each of external-connection terminals 6 may include, for example, a gold-plated layer.

Radio frequency module 1 includes a plurality of external-connection terminals 6 with a view to, for example, facilitating the mounting of radio frequency module 1 onto the mother board (external board) and having an increased number of ground electrodes.

(3.15) First Resin Member/Second Resin Member

As shown in FIG. 3, first resin member 71 is provided on first principal surface 51 of mounting board 5. First resin member 71 covers first principal surface 51 and the circuit elements disposed on first principal surface 51. First resin member 71 ensures the reliability of the circuit elements disposed on first principal surface 51, such as their mechanical strength (impact resistance) and humidity resistance. Stated differently, first resin member 71 is capable of protecting the circuit elements disposed on first principal surface 51.

As shown in FIG. 3, second resin member 72 is provided on second principal surface 52 of mounting board 5. Second resin member 72 covers second principal surface 52 and the circuit elements disposed on second principal surface 52. Second resin member 72 ensures the reliability of the circuit elements disposed on second principal surface 52, such as their mechanical strength (impact resistance) and humidity resistance. Stated differently, second resin member 72 is capable of protecting the circuit elements disposed on second principal surface 52.

(3.16) Disposition

As shown in FIG. 1 through FIG. 3, power amplifier 21, output matching circuit 42, first switch 47, and a plurality of transmission filters 31 are disposed on mounting board 5 in stated order in a direction that is orthogonal to the thickness direction D1 of mounting board 5. More specifically, power amplifier 21, output matching circuit 42, first switch 47, first duplexer 38, first matching circuit 43, antenna switch 49, and filter 33 are disposed on mounting board 5 in stated order in the direction described above that is orthogonal to the thickness direction D1 of mounting board 5.

Here, the end edge of each element at the power amplifier 21 side in the direction described above that is orthogonal to the thickness direction D1 of mounting board 5 serves as the reference of disposing each element. "Power amplifier 21, first switch 47, and first duplexer 38 are disposed in stated order in a direction that is orthogonal to the thickness direction D1 of mounting board 5" thus means that power amplifier 21, first switch 47, and first duplexer 38 are disposed in a manner that the end edge of power amplifier 21, the end edge of first switch 47, and the end edge first duplexer 38 are arranged in stated order.

This disposition enables simple wiring of power amplifier 21, output matching circuit 42, first switch 47, first duplexer 38, first matching circuit 43, antenna switch 49, and filter 33. Stated differently, such disposition simplifies first transmission path T11. Similarly, this disposition enables simple wiring of power amplifier 21, output matching circuit 42, first switch 47, second duplexer 39, second matching circuit 44, antenna switch 49, and filter 33. Stated differently, this disposition simplifies second transmission path T21.

In a plan view from the thickness direction D1 of mounting board 5, antenna switch 49 is disposed on mounting board 5 so as to be located opposite to power amplifier 21 with low-noise amplifier 22 interposed therebetween. This disposition increases the distance between antenna switch 49 and power amplifier 21, thus reducing interference from power amplifier 21 to antenna switch 49.

As shown in FIG. 1 through FIG. 3, power amplifier 21, first duplexer 38, second duplexer 39, output matching circuit 42, first matching circuit 43, second matching circuit 44, and input matching circuit 45 are disposed on first principal surface 51 of mounting board 5. Meanwhile, reception IC 24 (low-noise amplifier 22 and second switch 48), first switch 47, and antenna switch 49 are disposed on second principal surface 52 of mounting board 5.

This disposition reduces the footprint of power amplifier 21 and first switch 47 compared to the case where both the power amplifier and the first switch are disposed on the same principal surface of mounting board 5.

Further, part of first switch 47 overlaps at least one of transmission filters 31 in a plan view from the thickness direction D1 of mounting board 5. An example of FIG. 1 shows that part of first switch 47 overlaps first duplexer 38 and second duplexer 39.

As shown in FIG. 1 through FIG. 3, antenna switch 49 overlaps filter 33 in a plan view from the thickness direction D1 of mounting board 5. More specifically, part of antenna switch 49 overlaps part of filter 33 in a plan view from the thickness direction D1 of mounting board 5. Note that part of antenna switch 49 may overlap the entirety of filter 33 in a plan view from the thickness direction D1 of mounting board 5. Alternatively, the entirety of antenna switch 49 may overlap part or the entirety of filter 33 in a plan view from the thickness direction D1 of mounting board 5. Stated differently, at least part of antenna switch 49 overlaps at least part of filter 33 in a plan view from the thickness direction D1 of mounting board 5.

This disposition decreases the length of wiring between antenna switch 49 and filter 33, thus reducing the wiring loss. This disposition also reduces the footprint of antenna switch 49 and filter 33 in a plan view from the thickness direction D1 of mounting board 5 compared to the case where the antenna switch and the filter are disposed on the same principal surface of the mounting board.

As shown in FIG. 1 through FIG. 3, part of reception IC 24 (low-noise amplifier 22 and second switch 48) overlaps the entirety of input matching circuit 45 in a plan view from the thickness direction D1 of mounting board 5. Note that part of reception IC 24 may overlap part of input matching circuit 45 in a plan view from the thickness direction D1 of mounting board 5. Alternatively, the entirety of reception IC 24 may overlap part or the entirety of input matching circuit 45 in a plan view from the thickness direction D1 of mounting board 5. Stated differently, at least part of reception IC 24 overlaps at least part of input matching circuit 45 in a plan view from the thickness direction D1 of mounting board 5.

This disposition decreases the length of wiring between reception IC 24 (low-noise amplifier 22 and second switch 48) and input matching circuit 45, thus reducing the wiring loss. Such disposition also reduces the footprint of reception IC 24 and input matching circuit 45 in a plan view from the thickness direction D1 of mounting board 5 compared to the case where the reception IC and the input matching circuit are disposed on the same principal surface of the mounting board.

Mounting board 5 is in a right-angled square shape in a plan view from the thickness direction D1 of mounting board 5 and has four regions R1 in a plan view from the thickness direction D1 of mounting board 5. Four regions R1 result from dividing mounting board 5 into two regions both in a longitudinal direction D2 (first direction) and a lateral direction D3 (second direction) that are orthogonal to each other. Four regions R1 include first region R11, second region R12, third region R13, and fourth region R14. First region R11 and second region R12 are located at the opposite corners.

Power amplifier 21 is in first region R11 in mounting board 5 with the above structure. Meanwhile, low-noise amplifier 22 is in fourth region R14. This disposition reduces harmonic distortion that occurs in power amplifier 21.

(4) Detailed Structures of Structural Elements of Radio Frequency Module (4.1) Mounting Board Mounting board 5 shown in FIG. 1 through FIG. 3 is, for example, a printed wiring board, a low temperature co-fired ceramics (LTCC) board, and so forth. Here, mounting board 5 is, for example, a multi-layered board that includes a plurality of dielectric layers and a plurality of planar conductor portions 53. Dielectric layers and planar conductor portions 53 are laminated in the thickness direction D1 of mounting board 5. Each of planar conductor portions 53 is formed in a predetermined pattern. Each of planar conductor portions 53 includes one or more conductor portions on one plane that is orthogonal to the thickness direction D1 of mounting board 5. Each of planar conductor portions 53 is made, for example, of copper.

First principal surface 51 and second principal surface 52 of mounting board 5 are spaced apart from each other in the thickness direction D1 of mounting board 5. Each of first principal surface 51 and second principal surface 52 of mounting board 5 is disposed in a direction that intersects in the thickness direction D1 of mounting board 5. First principal surface 51 of mounting board 5 is orthogonal, for example, to mounting board 5 in the thickness direction D1 of mounting board 5, but a side of its conductor portion, for example, may not be orthogonal to the thickness direction D1. Second principal surface 52 of mounting board 5 is orthogonal, for example, to mounting board 5 in the thickness direction D1 of mounting board 5, but a side of its conductor portion, for example, may not be orthogonal to the thickness direction D1. First principal surface 51 and second principal surface 52 of mounting board 5 may have microscopic asperities, or a concave or convex portion.

(4.2) Duplexer

The following describes detailed structures of first duplexer 38 and second duplexer 39 shown in FIG. 1 through FIG. 3. The following description refers to first duplexer 38 and second duplexer 39 collectively as "duplexer" without distinction.

The duplexer includes filters on a single chip. Here, in the duplexer, a plurality of series arm resonators and a plurality of parallel arm resonators are formed by acoustic wave resonators. In this case, the duplexer includes, for example, a substrate, a piezoelectric layer, and a plurality of inter-digital transducer (IDT) electrodes. The substrate includes a first surface and a second surface. The piezoelectric layer is provided on the first surface of the substrate. The piezoelectric layer is provided on a low sound speed film. The IDT electrodes are provided on the piezoelectric layer. Here, the low sound speed film is provided on the substrate directly or indirectly. Also, the piezoelectric layer is provided on the low sound speed film directly or indirectly. The sound speed of a bulk wave propagating through the low sound speed film is slower than the sound speed of a bulk wave propagating through the piezoelectric layer. The sound speed of a bulk wave propagating through the substrate is faster than the sound speed of an acoustic wave propagating through the piezoelectric layer. The piezoelectric layer is made, for example, of lithium tantalate. The low sound speed film is made, for example, of silicon oxide. The substrate is, for example, a silicon substrate. The thickness of the piezoelectric layer is, for example, $3.5\lambda$ or less, where $\lambda$ is the wavelength of an acoustic wave that is defined by the electrode finger cycle of the IDT electrodes. The thickness of the low sound speed film is, for example, $2.0\lambda$ or less.

The piezoelectric layer is simply required to be formed, for example, of any one of lithium tantalate, lithium niobate, zinc oxide, aluminum nitride, and lead zirconate titanate. The low sound speed film includes at least one material selected from a group of silicon oxide, glass, silicon oxynitride, tantalum oxide, and a compound obtained by adding one of fluorine, carbon, and boron to silicon oxide. The substrate includes at least one material selected from a group of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

The duplexer further includes, for example, a spacer layer and a covering member. The spacer layer and the covering member are provided on the first surface of the substrate. The spacer layer surrounds a plurality of IDT electrodes in a plan view from the thickness direction of the substrate. The spacer layer has a frame shape (rectangular frame shape) in a plan view from the thickness direction of the substrate. The spacer layer has electrical insulating properties. The spacer layer is made, for example, of synthetic resin such as epoxy resin and polyimide. The covering member has a flat-plate shape. The covering member has a rectangular shape in a plan view from the thickness direction of the substrate, but may have another shape such as a square shape. In each filter, the outside size of the covering member is substantially the same as the outside size of the spacer layer in a plan view from the thickness direction of the substrate. The covering member is disposed on the spacer layer to face the substrate in the thickness direction of the substrate. The covering member overlaps the IDT electrodes in the thickness direction of the substrate, and is spaced apart from the IDT electrodes in the thickness direction of the substrate. The covering member has electrical insulating properties. The covering member is made, for example, of synthetic resin such as epoxy resin and polyimide. Each filter has a space defined by the substrate, the spacer layer, and the covering member. Such space in the filter contains gas. The gas is, for example, air and inert gas (e.g., nitrogen gas), and so forth. A plurality of terminals are exposed from the covering member. The terminals are, for example, bumps. Examples of the bumps include, but not limited to a solder bump. The bumps may be golden bumps.

The duplexer may include a contact layer interposed between, for example, the low sound speed film and the piezoelectric layer. The contact layer is made, for example, of resin (epoxy resin, polyimide resin). Also, the duplexer may include a dielectric film at one of: between the low sound speed film and the piezoelectric layer; on the piezoelectric layer; and under the low sound speed film.

The duplexer may include, for example, a high sound speed film interposed between the substrate and the low sound speed film. Here, the high sound speed film is provided on the substrate directly or indirectly. The low sound speed film is provided on the high sound speed film directly or indirectly. The piezoelectric layer is provided on the low sound speed film directly or indirectly. The sound speed of a bulk wave propagating through the high sound speed film is faster than the sound speed of an acoustic wave propagating through the piezoelectric layer. The sound speed of a bulk wave propagating through the low sound speed film is slower than the sound speed of a bulk wave propagating through the piezoelectric layer.

The high speed sound film is made of: a piezoelectric body such as diamond-like carbon, aluminum nitride, aluminum oxide, silicon carbide, silicon nitride, silicon, sapphire, lithium tantalate, lithium niobate, and crystal; various ceramics such as, alumina, zirconia, cordierite, mullite, steatite, and forsterite; magnesia; diamond; a material mainly composed of one of the above materials; or a material mainly composed of a compound of two or more of the above materials.

The high sound speed film is capable of trapping an acoustic wave inside of the piezoelectric layer and the low sound speed film, and thus the thickness of the high sound speed film may be the thicker the better. A contact layer, a dielectric film, and so forth as films other than the high sound speed film, the low sound speed film, and the piezoelectric layer may be included in a piezoelectric substrate.

A plurality of series arm resonators and a plurality of parallel arm resonators are not limited to the acoustic wave resonators described above, and thus may be, for example, SAW resonators or bulk acoustic wave (BAW) resonators. Here, SAW resonators include, for example, a piezoelectric substrate, and IDT electrodes provided on the piezoelectric substrate. When a plurality of series arm resonators and a plurality of parallel arm resonators are SAW resonators, each filter includes on one piezoelectric substrate a plurality of IDT electrodes in one-to-one correspondence with a plurality of series arm resonators and a plurality of IDT electrodes in one-to-one correspondence with a plurality of parallel arm resonators. The piezoelectric substrate is, for example, a lithium tantalate substrate, a lithium niobate substrate, and so forth.

(4.3) Switch

The following describes detailed structures of first switch 47, second switch 48, and antenna switch 49 shown in FIG. 1 through FIG. 3. The following description refers to first switch 47, second switch 48, and antenna switch 49 collectively as "switch" without distinction.

The switch is a switch IC. More specifically, the switch is, for example, a single chip IC that includes a substrate and a switch function unit. The substrate includes a first surface and a second surface on opposite sides of the substrate. The substrate is, for example, a silicon substrate. The switch function unit includes a field effect transistor (FET) formed on the first surface of the substrate. The switch function unit is a function unit capable of switching connections. The switch is flip-chip mounted on first principal surface 51 or second principal surface 52 of mounting board 5 in a manner that the first surface of the substrate faces mounting board 5. The outer peripheral shape of the switch is a square shape in a plan view from the thickness direction D1 of mounting board 5.

(4.4) Power Amplifier

Power amplifier 21 shown in FIG. 1 and FIG. 3 is, for example, a single chip IC that includes a substrate and an amplification function unit. The substrate includes a first surface and a second surface on opposite sides of the substrate. The substrate is, for example, a gallium arsenic substrate. The amplification function unit includes at least one transistor formed on the first surface of the substrate. The amplification function unit is a function unit capable of amplifying a transmission signal in a predetermined frequency band. The transistor is, for example, a heterojunction bipolar transistor (HBT). In power amplifier 21, power voltage from controller 23 is applied between the collector and the emitter of the HTB. Power amplifier 21 may include, for example, a DC-cut capacitor in addition to the amplification function unit. Power amplifier 21 is flip-chip mounted on first principal surface 51 of mounting board 5 in a manner that the first surface of the substrate faces first principal surface 51 of mounting board 5. The outer peripheral shape of power amplifier 21 is a square shape in a plan view from the thickness direction D1 of mounting board 5.

(4.5) Low-Noise Amplifier

The following describes a detailed structure of low-noise amplifier 22 shown in FIG. 2 and FIG. 3.

Low-noise amplifier 22 is, for example, a single IC chip that includes a substrate and an amplification function unit. The substrate includes a first surface and a second surface on opposite sides of the substrate. The substrate is, for example, a silicon substrate. The amplification function unit is formed on the first surface of the substrate. The amplification function unit is a function unit capable of amplifying a reception signal in a predetermined frequency band. Low-noise amplifier 22 is flip-chip mounted on mounting board 5 in a manner, for example, that the first surface of the substrate faces mounting board 5. The outer peripheral shape of low-noise amplifier 22 is a square shape in a plan view from the thickness direction D1 of mounting board 5.

(5) Communication Device

As shown in FIG. 4, communication device 8 includes radio frequency module 1, antenna 81, and signal processing circuit 82.

Antenna 81 is connected to antenna terminal 61 of radio frequency module 1. Antenna 81 has a transmission function of radiating by radio waves a first transmission signal and a second transmission signal outputted from radio frequency module 1, and a reception function of receiving a first reception signal and a second reception signal from outside as radio waves and outputting the first reception signal and the second reception signal to radio frequency module 1.

Signal processing circuit 82 includes RF signal processing circuit 83 and baseband signal processing circuit 84. Signal processing circuit 82 processes the first transmission signal and the first reception signal, and the second transmission signal and the second reception signal.

RF signal processing circuit 83, an example of which is a radio frequency integrated circuit (RFIC), performs signal processing on radio frequency signals.

RF signal processing circuit 83 performs signal processing, such as up conversion, on a radio frequency signal outputted from baseband signal processing circuit 84, and outputs the resulting radio frequency signal to radio frequency module 1. More specifically, RF signal processing circuit 83 performs signal processing, such as up conversion, on a first transmission signal outputted from baseband signal processing circuit 84, and outputs the resulting first transmission signal to first transmission path T11 of radio frequency module 1. RF signal processing circuit 83 also performs signal processing, such as up conversion, on a second transmission signal outputted from baseband signal processing circuit 84, and outputs the resulting second transmission signal to second transmission path T21 of radio frequency module 1.

RF signal processing circuit 83 performs signal processing, such as down conversion, on a radio frequency signal outputted from radio frequency module 1, and outputs the resulting radio frequency signal to baseband signal processing circuit 84. More specifically, RF signal processing circuit 83 performs signal processing on a first reception signal outputted from first reception path T12 of radio frequency module 1, and outputs the resulting first reception signal to baseband signal processing circuit 84. RF signal processing circuit 83 also performs signal processing on a second reception signal outputted from second reception path T22 of radio frequency module 1, and outputs the resulting second reception signal to baseband signal processing circuit 84.

Baseband signal processing circuit 84, an example of which is a baseband integrated circuit (BBIC), performs predetermined signal processing on a reception signal from outside of signal processing circuit 82. The reception signal processed in baseband signal processing circuit 84 is used, for example, as an image signal for image display, or as a sound signal for telephone conversation.

RF signal processing circuit 83 is also capable of functioning as a control unit that controls connections of first switch 47, second switch 48, and antenna switch 49 included in radio frequency module 1, on the basis of a communication band (frequency band) to be used. More specifically, RF signal processing circuit 83 switches connections of first switch 47, second switch 48, and antenna switch 49 included in radio frequency module 1 by a control signal (not illustrated). Note that the control unit may be provided outside of RF signal processing circuit 83. For example, the control unit may be provided in radio frequency module 1 or baseband signal processing circuit 84.

(6) Effects

In radio frequency module 1 according to the embodiment, power amplifier 21, output matching circuit 42, first switch 47, and a plurality of transmission filters 31 are disposed on mounting board 5 in stated order in a direction that is orthogonal to the thickness direction D1 of mounting board 5. This disposition enables simple wiring, because power amplifier 21, output matching circuit 42, first switch 47, and a plurality of transmission filters 31 are disposed in order in which the first transmission signal and the second transmission signal (transmission signals) pass through these structural elements.

In radio frequency module 1 according to the embodiment, power amplifier 21 is disposed on first principal surface 51 of mounting board 5 and first switch 47 is disposed on second principal surface 52 of mounting board 5. This disposition reduces the footprint of power amplifier 21 and first switch 47 compared to the case where both power amplifier 21 and first switch 47 are disposed on the same principal surface of mounting board 5.

In radio frequency module 1 according to the embodiment, antenna switch 49 that switches a connection between antenna terminal 61 and transmission filters 31 is disposed on mounting board 5 so as to be located opposite to power amplifier 21 with low-noise amplifier 22 interposed therebetween in a plan view from the thickness direction D1 of mounting board 5. This disposition increases the distance between antenna switch 49 and power amplifier 21, thus reducing interference from power amplifier 21 to antenna switch 49.

In radio frequency module 1 according to the embodiment, low-noise amplifier 22 and second switch 48 that switches a connection between low-noise amplifier 22 and reception filters 32 are integrated on a single chip. This disposition reduces the footprint of second switch 48 and low-noise amplifier 22 compared to the case where the second switch and the low-noise amplifier are separately provided.

(7) Variations

The following describes variations of the embodiment.

Figure 5:
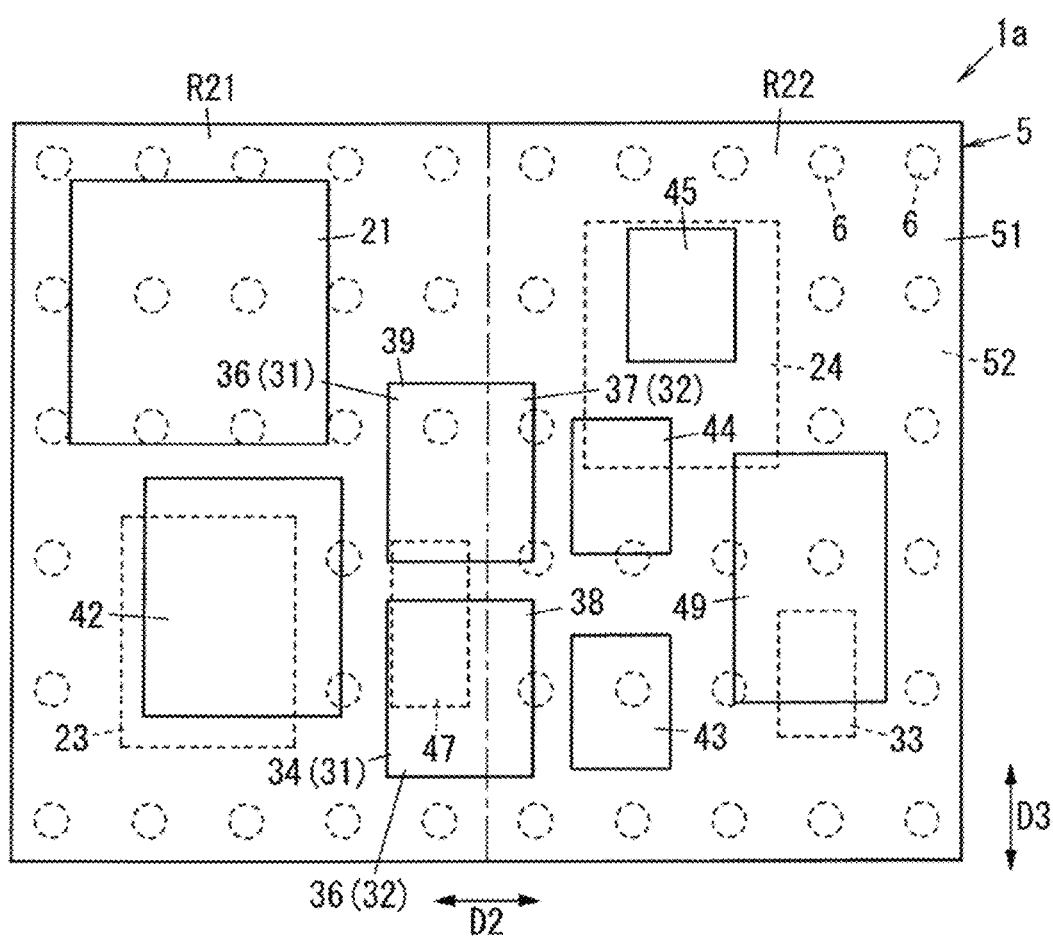
FIG. 5 is a front view of a radio frequency module according to variation 1 of the embodiment.

Variation 1 of the embodiment: in radio frequency module 1a, as shown in FIG. 5, filter 33 may be disposed on second principal surface 52 of mounting board 5, and antenna switch 49 may be disposed on first principal surface 51 of mounting board 5.

Figure 6:
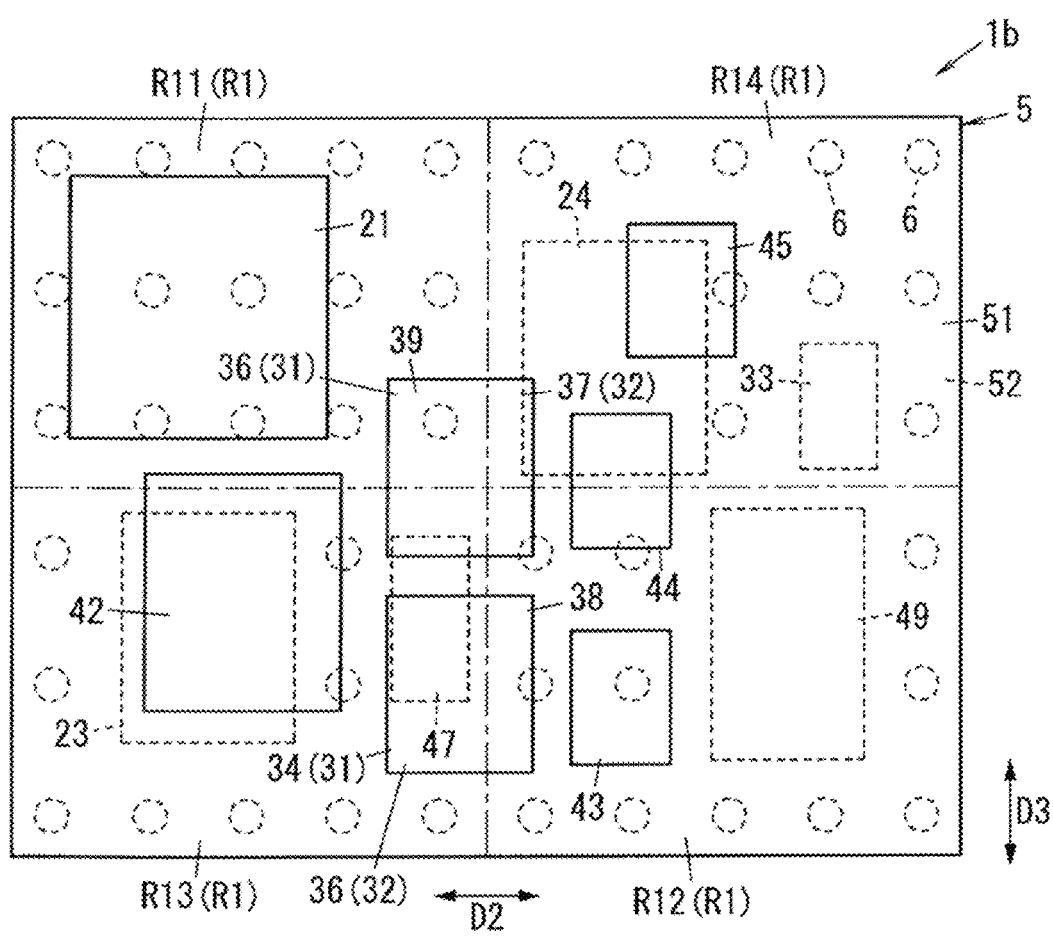
FIG. 6 is a front view of a radio frequency module according to variation 2 of the embodiment.

Variation 2 of the embodiment: in radio frequency module 1b, as shown in FIG. 6, both filter 33 and antenna switch 49 may be disposed on second principal surface 52 of mounting board 5.

Figure 7:
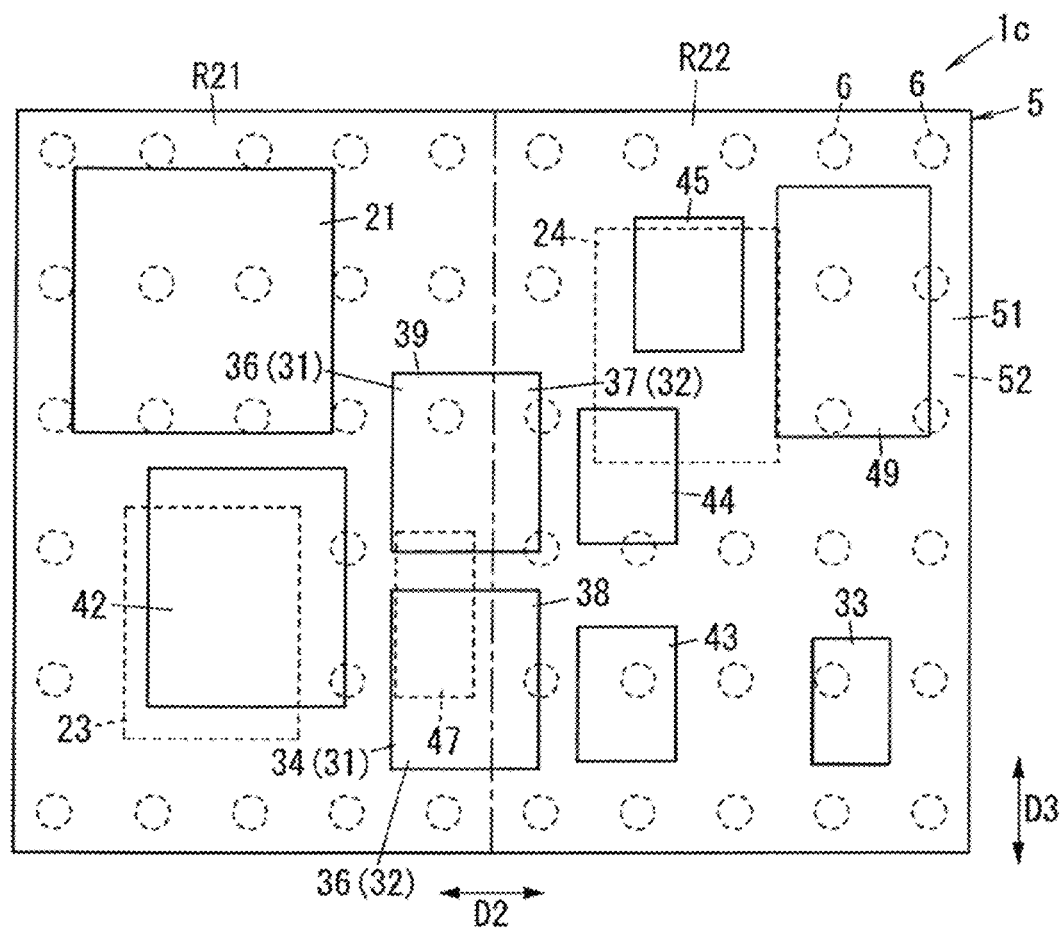
FIG. 7 is a front view of a radio frequency module according to variation 3 of the embodiment.

Variation 3 of the embodiment: in radio frequency module 1c, as shown in FIG. 7, both filter 33 and antenna switch 49 may be disposed on first principal surface 51 of mounting board 5.

Radio frequency module 1a and radio frequency module 1c according to variation 1 and variation 3, respectively, have first region R21 and second region R22 that result from dividing mounting board 5 in the longitudinal direction D2 of mounting board 5 in a plan view from the thickness direction D1 of mounting board 5. Power amplifier 21 is provided in first region R21. Reception IC 24 (low-noise amplifier 22 and second switch 48) and antenna switch 49 are provided in second region R22.

Figure 8:
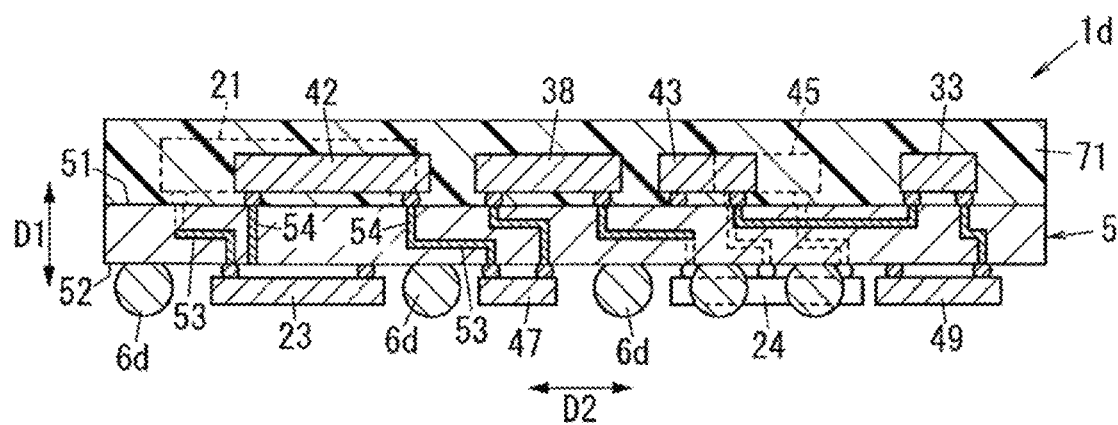
FIG. 8 is a cross-sectional view of a radio frequency module according to variation 4 of the embodiment.

Variation 4 of the embodiment: radio frequency module 1d may include a plurality of external-connection terminals 6d as shown in FIG. 8, instead of a plurality of external-connection terminals 6 (see FIG. 3).

Such external-connection terminals 6d are not electrodes having columnar shape but electrodes having a bump structure. External-connection terminals 6d are disposed on second principal surface 52 of mounting board 5. Radiofrequency module 1d according to variation 4 does not include second resin member 72 (see FIG. 3).

First duplexer 38 and second duplexer 39 according to the embodiment are, for example, surface acoustic wave filters. However, first duplexer 38 and second duplexer 39 are not limited to surface acoustic wave filters, and thus may be filters other than surface acoustic wave filters as another variation of the embodiment. First duplexer 38 and second duplexer 39 may be, for example, one of acoustic wave filters utilizing bulk acoustic wave (BAW), LC resonant filters, and dielectric filters.

Radio frequency modules according to the above variations achieve similar effects as those provided by radio frequency module 1 according to the embodiment.

The embodiment and variations described above are only some of various embodiments and variations of the present disclosure. Also, the embodiment and variations allow for various modifications that achieve the aim of the present disclosure, depending on design and so forth.

(Aspects)

The present specification discloses aspects described below.

Radio frequency module (1; 1a through 1d) according to a first aspect includes mounting board (5), power amplifier (21), a plurality of transmission filters (31), first switch (47), output matching circuit (42), low-noise amplifier (22), and external-connection terminal (6). Mounting board (5) includes first principal surface (51) and second principal surface (52) on opposite sides of mounting board (5). First switch (47) switches a connection between power amplifier (21) and transmission filters (31). Output matching circuit (42) is connected between power amplifier (21) and first switch (47). Low-noise amplifier (22) is disposed on second principal surface (52) of mounting board (5). External-connection terminal (6) is disposed on second principal surface (52) of mounting board (5). Power amplifier (21), output matching circuit (42), first switch (47), and transmission filters (31) are disposed on mounting board (5) in stated order in a direction that is orthogonal to the thickness direction (D1) of mounting board (5).

Radio frequency module (1; 1a through 1d) according to the first aspect enables simple wiring, because power amplifier (21), output matching circuit (42), first switch (47), and transmission filters (31) are disposed in order in which transmission signals (first transmission signal and second transmission signal) pass through these structural elements.

In radio frequency module (1; 1a through 1d) according to a second aspect, power amplifier (21) may be disposed on first principal surface (51) of mounting board (5). First switch (47) may be disposed on second principal surface (52) of mounting board (5).

Radio frequency module (1; 1a through 1d) according to the second aspect reduces the footprint of power amplifier (21) and first switch (47) compared to the case where both the power amplifier and the first switch are disposed on the same principal surface of the mounting board.

Radio frequency module (1; 1a through 1d) according to a third aspect may include antenna terminal (61) and antenna switch (49). Antenna switch (49) may switch a connection between antenna terminal (61) and transmission filters (31). Antenna switch (49) may be disposed on mounting board (5) so as to be located opposite to power amplifier (21) with low-noise amplifier (22) interposed therebetween in a plan view from the thickness direction (D1) of mounting board (5).

In radio frequency module (1; 1a through 1d) according to the third aspect, antenna switch (49) that switches a connection between antenna terminal (61) and transmission filters (31) is disposed on mounting board (5) so as to be located opposite to power amplifier (21) with low-noise amplifier (22) interposed therebetween in a plan view from the thickness direction (D1) of mounting board (5). This disposition increases the distance between antenna switch (49) and power amplifier (21), thus reducing interference from power amplifier (21) to antenna switch (49).

Radio frequency module (1; 1a through 1d) according to a fourth aspect may further include a plurality of reception filters (32) and second switch (48). Second switch (48) may switch a connection between low-noise amplifier (22) and reception filters (32). Second switch (48) and low-noise amplifier (22) may be integrated on a single chip.

Radio frequency module (1; 1a through 1d) according to the fourth aspect reduces the footprint of second switch (48) and low-noise amplifier (22) compared to the case where the second switch and the low-noise amplifier are separately provided.

In radio frequency module (1; 1a through 1d) according to a fifth aspect, power amplifier (21) and output matching circuit (42) may be disposed on first principal surface (51) of mounting board (5).

Radio frequency module (1; 1a through 1d) according to a sixth aspect may further include controller (23). Controller (23) may control power amplifier (21). Controller (23) may be disposed on second principal surface (52) of mounting board (5).

Radio frequency module (1; 1a through 1d) according to a seventh aspect may further include filter (33). Filter (33) may be provided at an output side of transmission filters (31). Filter (33) may be disposed on second principal surface (52) of mounting board (5).

Radio frequency module (1; 1a through 1d) according to an eighth aspect may further include antenna terminal (61), antenna switch (49), and filter (33). Antenna switch (49) may switch a connection between antenna terminal (61) and transmission filters (31). Filter (33) may be provided between antenna terminal (61) and antenna switch (49). Antenna switch (49) may overlap filter (33) in a plan view from the thickness direction (D1) of mounting board (5).

In radio frequency module (1; 1a through 1d) according to ninth aspect, part of first switch (47) may overlap at least one of transmission filters (31) in a plan view from the thickness direction (D1) of mounting board (5).

Radio frequency module (1; 1a through 1d) according to a tenth aspect may further include antenna terminal (61) and antenna switch (49). Antenna switch (49) may switch a connection between antenna terminal (61) and transmission filters (31). Antenna switch (49) may be disposed on second principal surface (52) of mounting board (5).

Communication device (8) according to an eleventh aspect includes radio frequency module (1; 1a through 1d) according to any one of the first through tenth aspects, and signal processing circuit (82). Signal processing circuit (82) processes signals (first transmission single, second transmission signal, first reception signal, and second reception signal).

Communication device (8) according to the eleventh aspect achieves simple wiring, because power amplifier (21), output matching circuit (42), first switch (47), and transmission filters (31) are disposed in the radio frequency module in order in which transmission signals (first transmission signal and second transmission signal) pass through these structural elements.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

The invention claimed is:

1. A radio frequency module, comprising:
 a mounting board including a first principal surface and a second principal surface on opposite sides of the mounting board;
 a power amplifier;
 a plurality of transmission filters;
 a first switch configured to switch a connection between the power amplifier and the plurality of transmission filters;
 an output matching circuit connected between the power amplifier and the first switch;
 a low-noise amplifier disposed on the second principal surface of the mounting board; and
 an external-connection terminal disposed on the second principal surface of the mounting board, wherein
 the power amplifier, the output matching circuit, the first switch, and the plurality of transmission filters are disposed on the mounting board in stated order in a direction that is orthogonal to a thickness direction of the mounting board.

2. The radio frequency module of claim 1, wherein the power amplifier is disposed on the first principal surface of the mounting board.

3. The radio frequency module of claim 2, wherein the first switch is disposed on the second principal surface of the mounting board.

4. The radio frequency module of claim 1, further comprising:
 an antenna terminal; and
 an antenna switch configured to switch a connection between the antenna terminal and the plurality of transmission filters.

5. The radio frequency module of claim 4, wherein in a plan view from the thickness direction of the mounting board, the antenna switch is disposed on the mounting board so as to be located opposite the power amplifier with the low-noise amplifier interposed therebetween.

6. The radio frequency module of claim 1, further comprising:
a plurality of reception filters; and
a second switch configured to switch a connection between the low-noise amplifier and the plurality of reception filters.

7. The radio frequency module of claim 6, wherein the second switch and the low-noise amplifier are integrated on a single chip.

8. The radio frequency module of claim 1, wherein the power amplifier and the output matching circuit are disposed on the first principal surface of the mounting board.

9. The radio frequency module of claim 1, further comprising:
a controller disposed on the second principal surface of the mounting board and configured to control the power amplifier.

10. The radio frequency module of claim 1, further comprising:
a filter provided at an output side of the plurality of transmission filters, wherein
the filter is disposed on the first principal surface of the mounting board.

11. The radio frequency module of claim 4, further comprising:
a filter provided between the antenna terminal and the antenna switch.

12. The radio frequency module of claim 11, wherein the antenna switch overlaps the filter in a plan view from the thickness direction of the mounting board.

13. The radio frequency module of claim 1, wherein part of the first switch overlaps at least one of the plurality of transmission filters in a plan view from the thickness direction of the mounting board.

14. The radio frequency module of claim 4, wherein the antenna switch is disposed on the second principal surface of the mounting board.

15. A communication device, comprising:
a radio frequency module comprising
a mounting board including a first principal surface and a second principal surface on opposite sides of the mounting board;
a power amplifier;
a plurality of transmission filters;
a first switch configured to switch a connection between the power amplifier and the plurality of transmission filters;
an output matching circuit connected between the power amplifier and the first switch;
a low-noise amplifier disposed on the second principal surface of the mounting board; and
an external-connection terminal disposed on the second principal surface of the mounting board, wherein
the power amplifier, the output matching circuit, the first switch, and the plurality of transmission filters are disposed on the mounting board in stated order in a direction that is orthogonal to a thickness direction of the mounting board; and
a signal processing circuit configured to process a signal.

16. The communication device of claim 15, wherein the power amplifier is disposed on the first principal surface of the mounting board, and
the first switch is disposed on the second principal surface of the mounting board.

17. The communication device of claim 15, wherein the radio frequency module further comprises
an antenna terminal; and
an antenna switch configured to switch a connection between the antenna terminal and the plurality of transmission filters, wherein
in a plan view from the thickness direction of the mounting board, the antenna switch is disposed on the mounting board so as to be located opposite the power amplifier with the low-noise amplifier interposed therebetween.

18. The communication device of claim 15, wherein the radio frequency module further comprises
a plurality of reception filters; and
a second switch configured to switch a connection between the low-noise amplifier and the plurality of reception filters, wherein
the second switch and the low-noise amplifier are integrated on a single chip.

19. The communication device of claim 15, wherein the power amplifier and the output matching circuit are disposed on the first principal surface of the mounting board.

20. A radio frequency module, comprising:
a mounting board including a first principal surface and a second principal surface on opposite sides of the mounting board;
a power amplifier;
a plurality of transmission filters;
a switch configured to switch a connection between the power amplifier and the plurality of transmission filters; and
an output matching circuit connected between the power amplifier and the first switch, wherein
the power amplifier, the output matching circuit, the first switch, and the plurality of transmission filters are disposed on the mounting board in stated order in a direction that is orthogonal to a thickness direction of the mounting board.

* * * * *